United States Patent [19]

Elings et al.

[11] Patent Number: 5,051,646
[45] Date of Patent: Sep. 24, 1991

[54] METHOD OF DRIVING A PIEZOELECTRIC SCANNER LINEARLY WITH TIME

[75] Inventors: Virgil B. Elings; John A. Gurley, both of Santa Barbara, Calif.

[73] Assignee: Digital Instruments, Inc., Santa Barbara, Calif.

[21] Appl. No.: 622,353

[22] Filed: Nov. 29, 1990

Related U.S. Application Data

[63] Continuation of Ser. No. 7/344,750, Apr. 28, 1989, abandoned.

[51] Int. Cl.$^5$ .......................................... H01L 41/08
[52] U.S. Cl. ................................... 310/317; 310/316; 310/328; 318/116
[58] Field of Search ...................... 310/311, 314–317, 310/326, 328, 330–332, 366, 369

[56] References Cited

U.S. PATENT DOCUMENTS

| | | | |
|---|---|---|---|
| 3,176,244 | 3/1965 | Newell et al. | 310/315 X |
| 3,414,794 | 12/1968 | Wood | 310/315 |
| 3,719,838 | 3/1973 | Peduto et al. | 310/315 |
| 3,899,728 | 8/1975 | Hoppe | 310/328 X |
| 3,916,226 | 10/1975 | Knoll | 310/317 |
| 4,263,527 | 4/1981 | Comstock | 310/316 |
| 4,267,478 | 5/1981 | Ljung et al. | 310/315 |
| 4,314,174 | 2/1982 | Wing et al. | 310/315 |
| 4,330,882 | 5/1982 | Stewart et al. | 310/316 X |
| 4,395,741 | 7/1983 | Kobayashi et al. | 310/317 X |
| 4,453,141 | 6/1984 | Rosati | 310/316 X |
| 4,514,773 | 4/1985 | Susz | 310/317 X |
| 4,608,506 | 8/1986 | Tanuma | 310/317 X |
| 4,663,555 | 5/1987 | Yoshihiro | 310/316 X |
| 4,841,191 | 6/1989 | Takata et al. | 310/328 X |
| 4,851,871 | 7/1989 | Ooe et al. | 310/317 X |
| 4,853,578 | 8/1989 | Takahashi et al. | 310/315 |
| 4,871,938 | 10/1989 | Elings et al. | 310/317 X |

Primary Examiner—Mark O. Budd
Attorney, Agent, or Firm—Oblon, Spivak, McClelland, Maier & Neustadt

[57] ABSTRACT

In a scanning device producing an image from data obtained from a nonlinear piezoelectric scanner having an attached end and a free end providing the data from a lateral scanning motion of the free end a distance about a center position as a result of the connection of a changing scan voltage to elecrodes carried by the piezoelectric scanner, a method of making the scanning motion of the free end linear with time and increasing the speed at which the data is provided for producing the image. The method comprises the steps of providing a nonlinear signal with time which is a function of the nonlinearity of the piezoelectric scanner; amplifying the nonlinear signal to provide a corresponding nonlinear driving voltage; applying the nonlinear driving voltage to the electrodes of the scanner to scan the free end in a forward scanning motion; obtaining data for use in producing the image during the forward scanning motion; applying the nonlinear driving voltage to the elctrodes of the scanner to scan the free end in a backward scanning motion; obtaining data for use in producing the image during the backward scanning motion; and, repeating the bi-directional scanning and data inputting process until the data needed to create the image has been obtained.

26 Claims, 3 Drawing Sheets

METHOD OF DRIVING A PIEZOELECTRIC SCANNER LINEARLY WITH TIME

This application is a continuation of application Ser. No. 07/344,750, filed on Apr. 28, 1989, now abandoned.

BACKGROUND OF THE INVENTION

This invention relates to scanners for devices such as scanning tunneling microscopes and atomic force microscopes and, more particularly, in a scanning device employing a nonlinear piezoelectric scanner having an attached end and a free end to produce a lateral scanning motion of the free end a distance d about a center position by the connection of a changing scan voltage to electrodes carried by the piezoelectric scanner, to the method of making the scanning motion of the free end linear with time comprising the steps of, providing a nonlinear signal with time which is a function of the nonlinearity of the piezoelectric scanner; amplifying the nonlinear signal to provide a corresponding nonlinear driving voltage; and, applying the nonlinear driving voltage to the electrodes of the scanner.

In a scanning probe microscope such as a scanning tunneling microscope (STM) or an atomic force microscope (AFM), a probe is scanned across the surface of a sample to determine properties of the surface such as topography or magnetic field strength so that these properties can be displayed for viewing. Alternately, the sample can be scanned across a fixed probe. Some of these microscopes, i.e., the STM and the AFM, have been constructed with the ability to resolve individual atoms by either scanning the probe or the sample. The scanner which provides the motion is usually a piezoelectric device adapted for moving in all three dimensions, i.e. in the X-Y plane and in the vertical (Z-axis) direction. As can be appreciated, if one is to resolve movement of a probe to the atomic level, the actuating mechanism must be stable and accurately moveable in small increments.

Recently, the three dimensional scanners have been made in the form of a tube whose probe- or sample-carrying end can be made to deflect in the X, Y and Z directions through the application of voltages to various electrodes on the tube. This type of positioner was first disclosed by Myer in U.S. Pat. No. 4,087,715 and was first reported for an STM by Binning and Smith in the Review of Scientific Instruments, Vol. 57, pp. 1688–1689, (1986), a copy of both having been filed in our co-pending application Ser. No. 305,637, filed Feb. 3, 1989 and entitled SCANNER FOR A SCANNING PROBE MICROSCOPE, the teachings of which are incorporated herein by reference. As depicted in simplified form in FIG. 1, the scanner 10 has electrodes on the outside and inside to which voltages are applied to cause the scanning action. The scanner 10 is attached to a structure at 12 and has a free end at 14 to which the probe 16 (or sample) is attached. By applying a voltage to some electrodes, the scanner 10 can be made to elongate and shorten as indicated by the dashed arrows and thereby create motion in the Z-axis. Likewise, by applying a voltage to other electrodes, the scanner 10 can be made to deflect the free end 14 to one side or the other, or both, and thereby create motion in the X- and Y-axes as indicated by the ghosted positions of FIGS. 1 and 2. The unique scanner of our above-referenced co-pending application is shown in FIGS. 3 and 4 wherein it is generally indicated as 10'. It features multiple inner and outer electrodes for scanning. It is shown in FIG. 3 as it would appear when scanning a sample 18 with respect to a fixed probe 16 and in FIG. 4 scanning a probe 16 over a fixed sample 18. The outer electrodes 20 and 22 are disposed on the surface of a tube 24 formed of a piezoelectric material. The electrodes 20 are X and Y electrodes which are disposed adjacent the attachment end 12 at 90° intervals with only a small break between them. The outer electrode 22 is a Z electrode which covers the full 360° of the outer surface adjacent the free end 14. The inner electrode 20' and 22' are in a similar pattern. The inner and outer scan electrodes are all connected to a scan driver 26 which applies the required voltages to the electrodes to create the desired scan pattern of the free end 14. The electrodes 20 and 20' are for scanning (i.e. movement of the probe 16, for example, in the X and Y directions) by bending the tube 24 as depicted by the ghosted positions in FIGS. 1 and 2. It is this X and Y scanning motion that is the primary problem area to which the present invention is directed. As those skilled in the art will readily recognize, scanners other than tubes can be used within the scope and spirit of the present invention even though the primary thrust of the disclosure is directed to piezoelectric tube scanners. For example, one could scan according to the methods of the present invention employing a bimorph bender as described by Gehrtz et al., J Vac Sci Technology, A6, Mar. 1988, p 432.

With acceptance and contemporary usage of such devices, it has become important to make scanning probe microscopes which have large scan ranges (up to several microns) and good mechanical stability. The motion of the piezoelectric scanner is essentially proportional to the electric field in the piezoelectric material, which is equal to the voltage across the material divided by the thickness of the tube. As described in out above-referenced co-pending application, complementary voltages x, -x and y, -y can be applied to the inner and outer scanning electrodes to give larger scan ranges and more symmetry. While such techniques can provide the larger scan range of movement desired, the inherent nature of the piezoelectric material used to form the tubes 24 begins to create problems of its own as the scan distance (i.e. the amount of bending created in the tube 24) is increased.

Scanning is typically accomplished in a so-called "raster" fashion such as that of the electron beam which creates a television picture; that is, the probe 16 (or sample) moves in, for example, the X direction at a high rate and in the perpendicular direction, i.e. the Y direction, at a low rate to trace out a path such as that indicated as 28 in FIG. 5. Data about the height, magnetic field, temperature, etc. of the surface 30 of the sample 18 is then collected as the probe 16 is moved along. In these scanners, the X and Y position of the probe 16 is inferred from the voltages which are applied to the electrodes on the piezoelectric material of the tube 24. In the prior art, these scan voltages (from the scan driver 26) are typically triangle functions in X and Y (vs time) to produce, if the deflection of the scanner is linear with voltage, a raster scan of the probe in both the X and Y directions. Often, DC voltages are also added to the scan electrodes to position the raster scan over differt areas of the sample surface; that is, to select where on the sample the center position of the raster scan will be. The triangle function has the feature that the voltage, and therefore presumably the probe position, changes at a constant rate so that the probe moves at a constant velocity back and forth in X while moving at a lower constant velocity up and down in Y. This constant velocity then allows data taken at constant time intervals (as the probe moves in X and Y) to also be spaced at constant distance intervals. Since computers can conveniently take data at constant time intervals, they could then plot the data in a two-dimensional array representing position, i.e. in an X-Y array. The motion in X and Y will usually consist of small steps because the scan voltages from the scan driver 26 are changed in finite increments, as a computer would do.

As the field of scanning probe microscopes has progressed and larger scans of up to several microns have been produced so that, for example, the properties of manufactured objects such as optical disks and magnetic recording heads can be measured, the inherent properties of the piezoelectric materials employed in the tubes has begun to affect the above-described scanning process adversely. This is because, unfortunately, piezoelectric material, especially that of high sensitivity, is not a linear material; that is, the deflection of the material is not linear with the voltage applied to the electrodes. Also, the material has hysteresis so that reversals in the direction in which the voltage is changing do not produce a proportional reversal in the direction in which the position of the probe changes. Thus, a triangular voltage in time applied to the electrodes on the piezoelectric material in the manner of the prior art as described above does not produce a linear scan in time. This is illustrated in FIG. 6 where the position of a probe on the scanner as a function of the driving voltage for a one dimensional scan is graphed in simplified form. Notice that as the direction of the voltage changes at the ends of the scan, the position does not trace out the same path. This property of piezoelectric materials is well known and is classified as either hysteresis or "creep". For example, it is noted in U.S. Pat. No. 4,689,516 and also illustrated in piezoelectric material catalogs such as that from the Tokin Corporation of San Jose, Calif.

Sensitivity variation with voltage and the hysteresis make it such that the position of the probe is not linear with the voltage applied to the electrodes on the piezoelectric material. The prior art solved this by putting capacitors in series with the electrical leads to the electrodes as shown in a diagram from a Japanese paper by Sie, et al. (a copy of which is filed herewith). The creep of a piezoelectric material over 200 seconds is shown before and after insertion of capacitors whose size is, order of magnitude, equal to the capacitances of the piezoelectric device. Although this approach improves the creep of the piezoelectric material after voltage is applied to the device, much of the applied voltage appears across the added capacitors, reducing the total voltage which can be applied to the piezoelectric device and limits the range of scanning. Accordingly the capacitor solution to the creep problem is self-defeating to the primary objective of obtaining larger scans and is, therefore, an unattractive and unacceptable solution.

Another possible solution to the hysteresis problem is to apply triangular voltage patterns to the electrodes, let the piezoelectric material scan in a non-linear manner, take data spaced evenly in time (but not space) and then correct the positions of the data in the X-Y array to form a linear array. This would require interpolation of all the data points and would also make it difficult to produce realtime linear images since many calculations would be required as the data is being collected; but, of course, the difficulty of this solution depends on the computing power available. For the smaller laboratory on a limited budget for equipment, the computing intensity and, therefore, the computing power that must be available to implement this approach is probably prohibitive. Incidentally, this method is described by Gehrtz et al. in their previously mentioned article.

Wherefore, it is an object of this invention to provide a method for operating conventional prior art piezoelectric scanners to produce a raster scan that is evenly spaced in both time and space.

It is another object of this invention to provide a method for operating conventional prior art piezoelectric scanners to produce a raster scan which automatically adjusts for changes required by different scan distances.

Other objects and benefits of the invention will become apparent from the description which follows hereinafter when taken in conjunction with the drawing figures which accompany it.

SUMMARY

The foregoing objects have been achieved in a scanning device employing a nonlinear piezoelectric scanner having an attached end and a free end to produce a lateral scanning motion of the free end a distance d about a center position by the connection of a changing scan voltage to electrodes carried by the piezoelectric scanner, by the method of the present invention for making the scanning motion of the free end linear with time comprising the steps of, providing a nonlinear signal with time which is a function of the nonlinearity of the piezoelectric scanner; amplifying the nonlinear signal to provide a corresponding nonlinear driving voltage; and, applying the nonlinear driving voltage to the electrodes of the scanner.

In an alternate approach, the method can be used to produce linear data for use in calculations related to a surface scanned by the scanner and comprises the steps of, choosing a general formula describing a nonlinear function approximating the nonlinearity of the piezoelectric scanner and containing changeable parameters by means of which the nonlinear function described by the formula can be changed; using the piezoelectric scanner to scan a subject surface and produce data regarding characteristics of the subject surface; calculating the characteristics from the data for one scan direction and the characteristics from the data for an opposite scan direction; adjusting the parameters until differences between the characteristics from the data for the two scan directions are minimized which can only occur when the two scan directions are linear whereby the parameters are established to cause the formula to produce the required nonlinear function specifically describing the nonlinearity of the piezoelectric scanner; and, during scanning, employing the parameters to adjust the indication of the associated positions where the data received regarding the subject surface was taken whereby the data is associated with the actual positions on the subject surface at which it was taken.

In a scanning device producing an image from data obtained from a nonlinear piezoelectric scanner having an attached end and a free end providing the data from a lateral scanning motion of the free end over a distance d about a center position as a result of the connection of a changing scan voltage to electrodes carried by the piezoelectric scanner, the method can be employed to make the scanning motion of the free end linear with time and increase the speed at which the data is provided for producing the image. In such applications, the method comprises the steps of, providing a nonlinear signal with time which is a function of the nonlinearity of the piezoelectric scanner; amplifying the nonlinear signal to provide a corresponding nonlinear driving voltage; applying the nonlinear driving voltage to the electrodes of the scanner to scan the free end in a positive direction; obtaining data for use in producing the image during the positive direction scanning motion; applying the nonlinear driving voltage to the electrodes of the scanner to scan the the free end in a negative direction; obtaining data for use in producing the image during the negative direction scanning motion; and, repeating the bi-directional scanning and inputting steps until the data needed to create the image has been obtained.

DESCRIPTION OF THE PREFERRED EMBODIMENT

Figure 1:
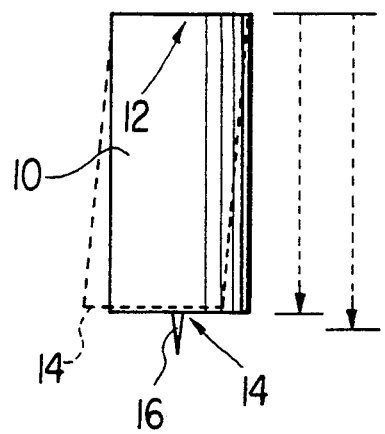
FIG. 1 is a simplified side view of a typical prior art piezoelectric scanner showing the three axes of movement produced thereby.
Figure 2:
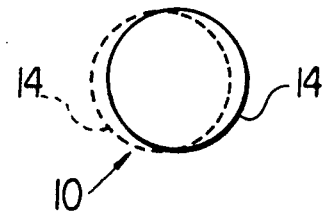
FIG. 2 is a simplified top view of the scanner of FIG. 1 showing the sideward deflection thereof.
Figure 3:
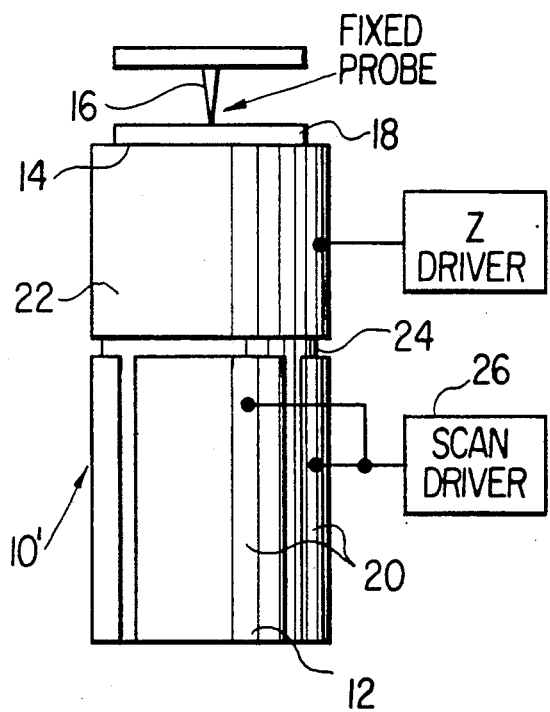
FIG. 3 is a more detailed drawing of a prior art piezoelectric scanner configured to move a sample affixed to the end thereof in a scanning pattern with respect to a fixed scan probe.
Figure 4:
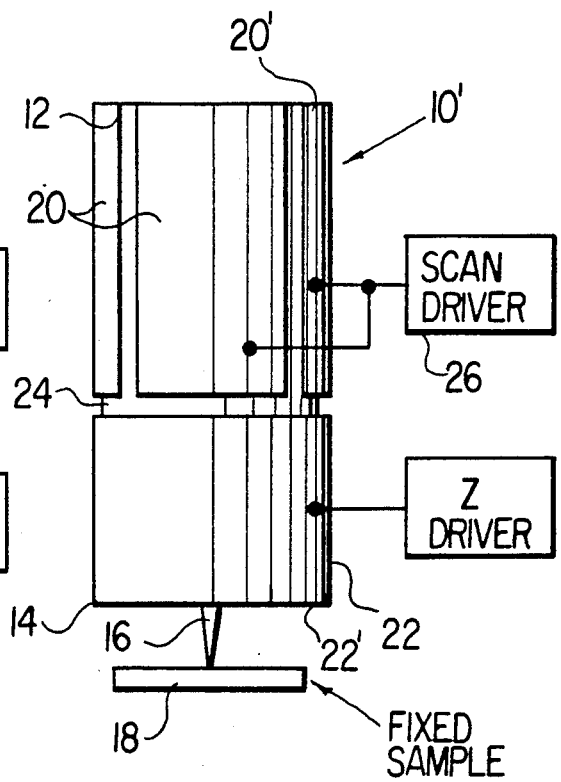
FIG. 4 is a more detailed drawing of a prior art piezoelectric scanner configured to move a scan probe affixed to the end thereof in a scanning pattern with respect to a fixed sample.
Figure 5:
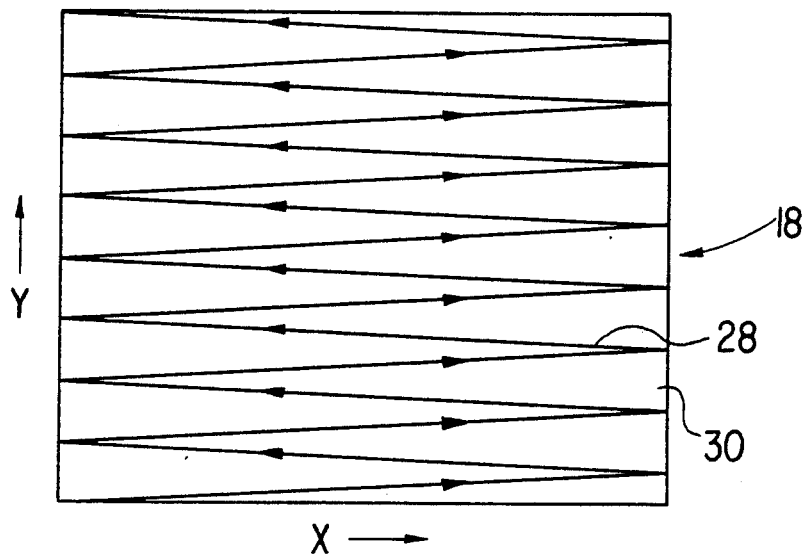
FIG. 5 is a simplified drawing of the scanning movement that is desired to be achieved by scanning apparatus employing the prior art piezoelectric scanners of FIGS. 1-4.

Simply stated, this invention is a method of applying the voltages to the electrodes of the piezoelectric material in a manner which causes the material to deflect linearly with time so that data taken at constant time increments will also be spaced at constant distance increments without a loss of voltage driving capacity as in the prior art. In other words it is a unique logic to be implemented in the scan driver 26 of FIGS. 3 and 4 which will apply these self-compensating and automatically adjusting voltages to the X and Y scanning electrodes of the scanner 10'. The method implemented is to change the voltage on the piezoelectric scanner 10' at a rate which decreases with time during one scan line (X) and one scan frame (Y) in order to produce a scan in which the position of the probe 16 changes at a constant rate. Also, the percent nonlinearity of the applied voltage in the method is decreased as the total scan size, d, is decreased. The particular form of the nonlinear voltage in each case is pre-calibrated to match the properties of the particular piezoelectric scanner 10' being employed. This could be a factory pre-calibration procedure which would then free the user from worry about such matters in use; or, it could be adjusted by the user. In a preferred version of the method, the voltage is changed by small increments which are the sum of a constant term and an exponentially decaying term. The voltage is incremented at constant time intervals. Alternately, in a nonpreferred version the nonlinear voltage could consist of constant increments applied at time intervals which vary across the scan, the time interval increasing along the scan line and scan frame.

Figure 7:
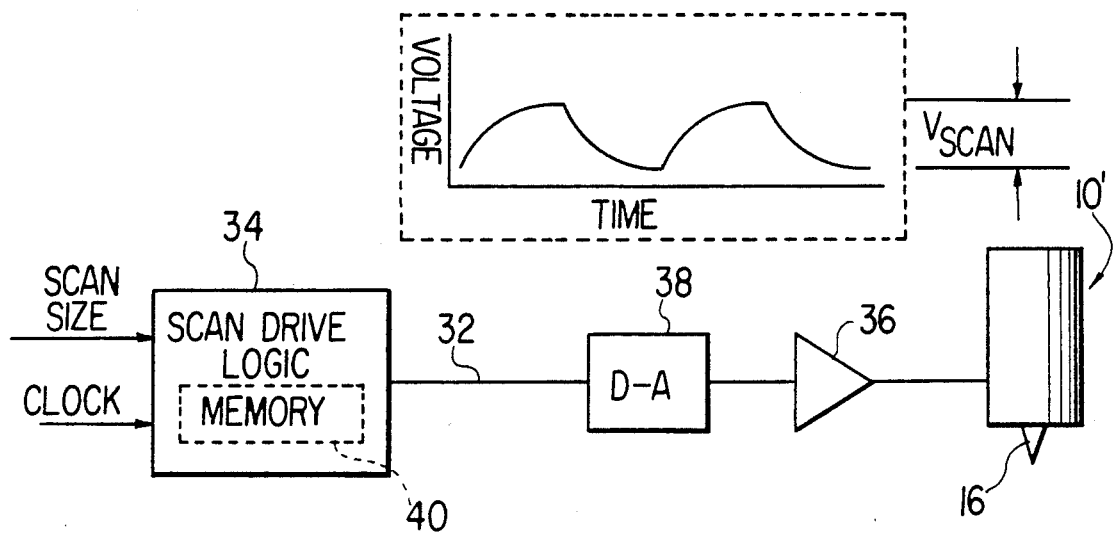
FIG. 7 is a simplified drawing of apparatus employed to practice the method of the present invention whereby a nonlinear voltage is applied to drive a piezoelectric scanner in a linear manner with time.

FIG. 7 shows a block diagram of the apparatus employed in testing the method of this invention by the inventors herein. The method as tested was to have a nonlinear waveform as depicted being input at 32 and output by the scan drive logic 34, whose rate of change decreases during the scan, drive an amplifier 36 through a digital to analog converter (D-A) 38, which then drives the piezoelectric scanner 10' in a linear manner with time. The waveform of 32 is either pre-determined from the characteristics of the piezoelectric element being used or can be calculated in real time from parameters input by the operator. Within the scan drive logic 34, the waveform could be stored in a digital memory 40 and then be clocked out to the amplifier 36 at a constant clock rate in order to move the probe 16 in a linear manner; or, it could be calculated from a formula as the probe is being scanned. Alternately, a constant increment in the voltage could be applied at variable time intervals which have been stored in the memory 40 or which are calculated during the scan. These variable intervals could be some number of the input clock cycles, the number increasing along the scan and being stored in the memory 40 or calculated during the scan. At the present time, the inventors herein find it more useful to precalculate the waveform as a list of numbers for a particular scan size and scan rate (i.e., clock rate) and then just look up the numbers from the memory 40 during scanning. The inventors have also employed the method where the numbers are calculated "on the fly" (i.e., during the scan) and feel that this approach will become the preferred approach as the general availability of low cost, high speed computing power increases.

The pre-calibration procedure by which the nonlinear waveform used to drive the piezoelectric scanner 10' is determined can be accomplished by using the particular scanner 10' being calibrated to scan a probe 16 over a calibrated surface, such as a diffraction grating (for large scale scanners) or an atomic crystal (for small scale scanners), using a known waveform, such as a triangular waveform, and then measuring the resulting nonlinear image collected to work backwards and determine the driving waveform needed to produce a linear image. One could also monitor the motion of the probe 16 with, for example, an interferometer to obtain the nonlinearity of the scan using a linear waveform, and again work backwards to determine the nonlinear waveform needed for driving the scanner in a linear manner.

Another approach the inventors have used with success to determine the nonlinear driving waveform, when the waveform is calculated from a formula with variable parameters, is to vary the parameters in an iterative fashion while a scan is being made until the scan, as seen by the data image or from a position measuring device such as an interferometer, is linear. For a formula with only a few parameters, this iteration process of pre-calibration can be done quickly and easily.

Figure 6:
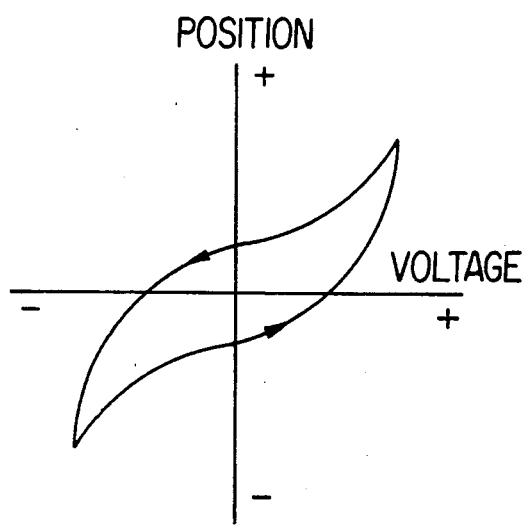
FIG. 6 is a simplified graph depicting the actual position versus voltage action that takes place in a prior art scanner employing prior art driving methods.
Figure 8:
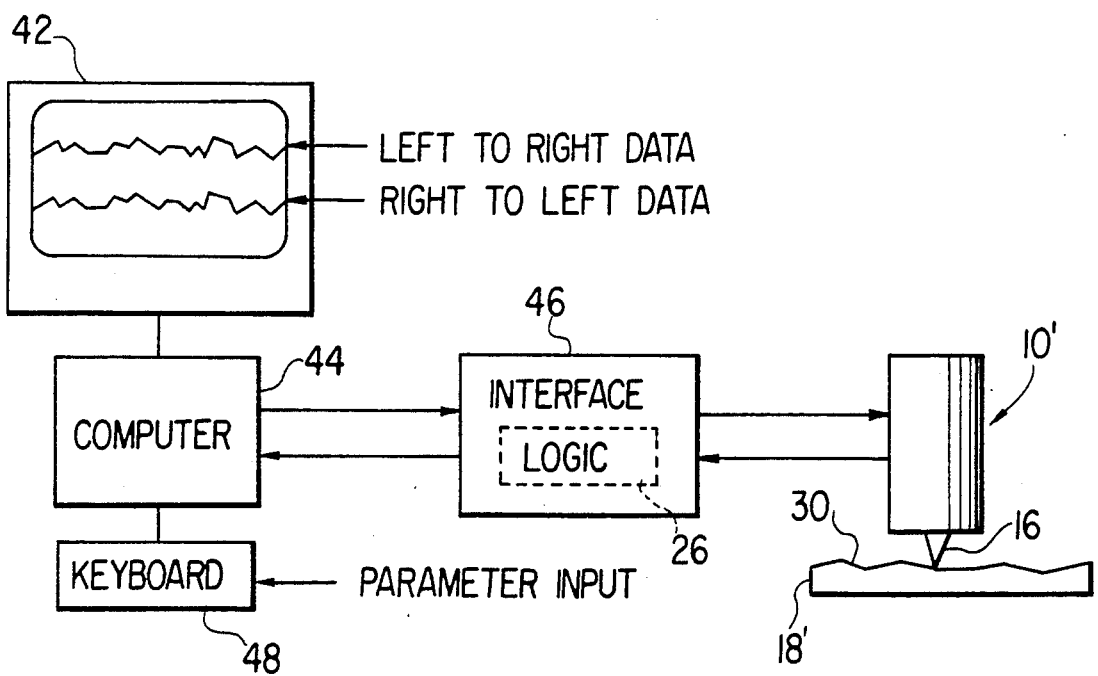
FIG. 8 is a simplified drawing of apparatus employed to practice the method of the present invention whereby the parameters for a changing voltage waveform or a changing time increment are determined by an iterative process.

As depicted in FIG. 6, the nonlinearity of the piezoelectric scanner is such that for a linear voltage driving waveform, the scan in the +X direction is different from the scan in the −X direction. Another method of determining the correct nonlinear driving waveform is to observe data taken from the probe 16 in the +X direction and −X directions and to vary the voltage waveform until the data taken in the two directions agree. This will occur only when the scan in each direction is linear and is a method of determining the correct driving waveform even when a specially calibrated sample is not available. In this design of an instrument, it would be possible to provide a user with the ability to observe the data in the +X and −X directions and to allow the user to vary the driving waveform with software to make the data waveforms agree. This would allow the user to be able to linearize or check linearization easily for his/her system without the need for special equipment. Such an on-site linearizing scanning probe microscope is depicted in simplified form in FIG. 8. The probe 16 is set to scan a sample 18' in a +X and −X direction and the derived data is displayed such as on the monitor 42 connected to the computer 44 which, in turn, is connected to the scanner 10' by the interface unit 46 which includes the scan driver 26 and logic to receive the data from the probe 16 and transmit it to the computer 44 for calculation and display. The parameters from the operator are input through, for example, a keyboard 48.

Linearization in the Y direction would be accomplished by collecting frames of data in the +Y and −Y directions and varying the Y driving waveform to make the data in the frames agree. It should be noted that the parameters could also be adjusted by the computer to get the best comparison between the +X and −X direction data. For example, the computer could be programmed to adjust the parameters in a manner which will minimize the square of the differences between the data for the two scan directions. Such programming techniques are well known to those skilled in the art and, per se, form no part of the novelty of the present invention. Accordingly, in the interest of simplicity and the avoidance of redundancy, they will not be explained in any detail herein.

It is also worthy of note at this point that because of the hysteresis problem, present prior art scanning probe microscopes, and the like, now only take data as the probe moves in one direction, e.g., +X, since data taken in the two directions will not agree spatially and cannot be used to make a single image. In the above-described systems of the present invention, with the scan linearized, data could be taken in both the +X and −X directions with the result that the data taking would be twice as fast.

In their testing of this invention, the inventors have found that the nonlinear portion of the applied voltage increments must decrease from the beginning to the end of a scan line (X direction) and beginning to end of a frame (Y direction); that is, the rate of change of the scanning voltage must start high at the beginning of a scan and then decrease. This is also true in the reverse direction of the scan; that is, if one wants the scan to be linear as the probe moves in either direction, the rate of voltage change must start at a high rate, in either direction, and decrease toward the end of the scan line. To a good approximation, the inventors herein have found that the nonlinearity in the piezoelectric scanners does not depend on the rate at which they are driven; that is, on the rate at which the waveform is clocked out to the scanners. This is true over rates which vary by a factor of 100. They have also found that a simple nonlinear waveform which produces a linear scan. This is a waveform which contains a linear term and a decaying exponential term in which only three adjustable parameters need to be determined in order to produce linear scans over all scan ranges and rates.

The inventors' preferred embodiment uses a waveform made up of several points (N) per scan in which the nth change $\Delta V(n)$ to the voltage applied to the scanner during one scan line is given by:

$$\Delta V(n) = C\left(1 + \frac{V_{scan}}{V_{cal}} Be^{-Kn/N}\right)$$

where C, B, and K are parameters which are determined from measurements on the scanner; N is the number of points in one scan line (i.e., N−1 is the number of voltage increments); and, n is the number of the point on the scan at which the increment is being made. $V_{scan}$ is the total scan voltage (as depicted in FIG. 7) and $V_{cal}$ is the calibration scan voltage at which B and K were determined. C is related to the total scan voltage desired. It should be noted that the parameters C, B, and K may depend on the DC offset voltages applied to the scan electrodes for centering the scan; but, in the first approximation, they are constants, independent of the offset voltages.

In the above formula for $\Delta V$, we see that the voltage increments at the beginning of a scan line are larger than the increments at the end of a scan line; that is, the voltage is increasing (or decreasing) at a faster rate at the beginning of a scan than at the end in order to make the probe move at a constant rate. In the formula, K determines how rapidly the nonlinear term decreases across one scan line and B determines the size of the nonlinear term. For a scanner with no hysteresis, one would have B=0, i.e. $\Delta V$=C (a constant). The inventors found that they could determine these two factors fairly quickly by scanning an object which has a calibrated grid on it and varying the parameters until the image of the grid is linear. For instance, they found that for one particular scanner these values were: B=0.6 and K=3. It should be noted that both parameters are dimensionless. For this design, the nonlinear term in the voltage increments varies by a factor of 20 across one scan line—no small effect. Also, at the beginning of the scan, if $V_{scan}=V_{cal}$, the nonlinear term is 60% as large as the linear term, again not a small effect. The inventors have found that decreasing the nonlinear term by the ratio $V_{scan}/V_{cal}$ gives a good approximation to the properties of the scanners. At small scans (small $V_{scan}$), the nonlinear term becomes very small, and the applied voltage becomes almost linear.

This particular form of the nonlinear voltage waveform is easy to calculate in real time while the scan is being made since the nonlinear term at any point n is just $e^{-K/N}$ (which can be pre-calculated) times the previous nonlinear term. For example, if $\Delta V(n)=C(1+A(n))=C+D(n)$, then $D(n+1)=D(n)e^{-K/N}$ which requires only one multiplication and one addition in order to calculate the next voltage increment. One can easily add more exponential terms to the formula to give more fitting parameters. The general formula would be of the form:

$$\Delta V(n) = C + \sum_{i=1}^{M} A_i e^{-K_i n}$$

where there are M exponentially decreasing terms and the $A_i$'s depend on the scan size.

In practice, the inventors have found that the above expression for $\Delta V$ will produce a linear scan for a particular value of $V_{scan}$; but, if $V_{scan}$ is doubled, for instance, the actual scan range of the probe more than doubles. The inventors have found, approximately, that d(scan size)=$A \cdot V_{scan} + E \cdot (V_{scan})^2$. That is, the actual probe scan size in microns varies nonlinearly with the scan voltage $V_{scan}$. E typically has values near 0.2 Å/volt² if A has the value of about 300 Å/volt. This can be taken care of in two ways: (1) include the correction in the scan voltage $V_{scan}$; or, (2) simply have the data taking system re-label the dimensions on the data array; that is, the axis (d) would be calculated from $V_{scan}$ using the above formula.

The nonlinear waveform could also be made in the form of increments $\Delta V(n) = C(1 + f(n))$ where f(n) is a monotonically decreasing function in n such as $f(n) = an + bn^2 + cn^3$ . . . As many terms would be included as needed to make the scan linear. These voltage increments could be pre-calculated before the scan or calculated during the scan. Again, the coefficients a, b, c, etc. would come from measurements on the scanner such that the scan would be linear in time during a scan line. Some of the coefficients would undoubtedly be negative in order that f(n) would decrease with increasing n. A function of the above form can also be calculated quickly in real time, requiring only three adds per point.

In all of these various specific ways of forming the nonlinear voltage, it would be done for both the X- and Y-scan axis with the coefficients being either the same or different for each axis. This, of course, would depend on the symmetry of the scanner and whether the piezoelectric material had a rate dependence since, as described above, one axis typically is scanned much slower than the other axis.

As mentioned earlier, in order to obtain the nonlinear voltage the increments in the scanning voltage could be constant, but applied at variable time intervals. For instance, for the exponentially decreasing rate, one would have:

$$\Delta t(n) = \frac{A}{\left(1 + \frac{V_{scan}}{V_{cal}} B e^{-Kn/N}\right)}$$

where B and K are as before and where we see that $\Delta t$ increases with increasing n, to produce a decreasing rate of voltage change. $\Delta t(n)$ could be pre-determined and stored in the memory 40 as being counts of a clock where each time the proper number of counts were reached, the voltage to the scanner would be incremented. This approach is not as attractive as the increasing of the voltage at constant time intervals since constant time intervals are easier for computers to execute and the variable voltage increment is easily done. The primary difficulty is that most signal processing algorithms require a constant time interval. For these reasons, while this approach is to be considered within the scope and spirit of the present invention with respect to the breadth accorded the appended claims hereto, it is not a preferred approach. It would be straightforward to add more exponential terms to the formula.

As mentioned earlier herein, the present invention is applicable to other types of scanners besides those employing a tube and piezoelectric materials (such as a bimorph as mentioned earlier herein). Accordingly, despite the use of the term "piezoelectric" in the claims which follow hereinafter, it is the inventors' intent that other types of scanners and materials be included within that term in order to fall within the scope and spirit of the invention disclosed herein.

Wherefore, having thus described our invention, what is claimed is:

1. In a method of scanning a nonlinear piezoelectric scanner having an attached end and a free end to produce a cyclic lateral scanning motion of the free end over a distance d by the application of a changing scan voltage to electrodes carried by the piezoelectric scanner, the improvement by which the scanning motion of the free end is made linear with time, comprising the steps of:
   producing a nonlinear driving voltage which is a predetermined function of the nonlinearity of the particular piezoelectric scanner being employed, said predetermined function at least including a term which varies as a function of position of the free end within a scan; and operating in an open-loop mode by applying the nonlinear driving voltage to the electrodes of the scanner.

2. The method of claim 1 wherein said step of producing a nonlinear driving voltage comprises the step of:
   determining a voltage increment to be applied at constant time intervals during each of repeated lateral scanning motions of the free end.

3. The method of claim 2 wherein said step of producing a nonlinear driving voltage includes the step of:
   adjusting parameters of a general formula to make the general formula closely describe the nonlinear nature of the scanner; and,
   calculating the voltage increment using the adjusted general formula.

4. The method of claim 1, wherein said step of producing a nonlinear driving voltage comprises the step of:
   determining a base voltage increment plus a decreasing variable voltage increment which varies as a function of position in the line scan to be applied at constant time intervals during each of repeated lateral scanning motions of the free end.

5. The method of claim 4 wherein said step of determining a base voltage increment plus a decreasing variable voltage increment includes the step of:
   making the variable voltage increment smaller in relation to the base voltage increment the smaller the size d of the scan.

6. The method of claim 2 wherein said step of determining a voltage increment to be applied at constant time intervals includes the step of:
   calculating the voltage increment to be added at each time interval during scanning.

7. The method of claim 2, wherein said step of determining a voltage increment includes the step of:
   calculating the voltage increment to be added at each time interval as an exponentially decreasing voltage which decreases as a function of position in the line scan.

8. The method of claim 7, wherein the percent nonlinearity of the voltage increment decreases as the total scan side, d, is increased.

9. The method of claim 3 wherein said step of calculating the voltage increments from the general formula includes the steps of:
(a) calculating the voltage increments to be added at each time interval prior to scanning;
(b) storing the voltage increments in a computer memory; and,
(c) retrieving each next voltage increment for a time interval from the memory during scanning.

10. The method of claim 3, comprising the steps of:
(a) choosing as said general formula a nonlinear function approximating the nonlinearity of the piezoelectric scanner and containing changeable parameters by means of which the nonlinear function described by the formula can be changed;
(b) using the piezoelectric scanner to scan a subject surface in forward and backward directions and produce data regarding characteristics of the subject surface;
(c) calculating nonlinearity characteristics from the data for the forward scan direction and from the data for the backward scan direction; and,
(d) adjusting the parameters until the differences between the characteristics from the data for the forward scan direction and the characteristics from the data for the backward scan direction are minimized, whereby the parameters are established to cause the formula to produce the required nonlinear function specifically describing the nonlinearity of the piezoelectric scanner.

11. The method of claim 3, comprising:
choosing as said general formula a waveform made up of several points (N) per scan in which the nth increment $\Delta V(n)$ to the voltage applied to the scanner during one scan line is given by:

$$\Delta V(n) = C \left( 1 + \frac{V_{scan}}{V_{cal}} B e^{-Kn/N} \right)$$

where C, B, and K are parameters which are predetermined from measurements on the scanner; N is the number of points in one scan line (i.e., N−1 is the number of voltage increments); n is the number of the point on the scan at which the increment is being made; $V_{scan}$ is the total scan voltage; $V_{cal}$ is the calibration scan voltage at which B and K were determined; and C is related to the total scan voltage desired and normalizes the sum of the $\Delta V$'s to $V_{scan}$.

12. The method of claim 3, comprising:
choosing as said general formula a nonlinear waveform in the form of increments $\Delta V(n)$, wherein $$\Delta V(n) = C + \sum_{i=1}^{M} A_i e^{-K_i n}$$

where C is a predetermined parameter related to the total scan voltage desired and in which there are M exponentially decreasing terms and the $A_i$'s are a function of the scan size.

13. The method of claim 3, comprising:
choosing as said general formula a nonlinear waveform in the form of increments $\Delta V(n)$, wherein $\Delta V(n) = C(1+f(n))$, where $f(n)$ is a function in n and n is the number of the increment along a scan line.

14. The method of claim 13 wherein:
said monotonically decreasing function in n is of the form $f(n) = an + bn^2 + cn^3 \ldots$ 15. The method of claim 3 wherein said step of calculating the voltage increments to be added at each time interval from the general formula includes the steps of:
(a) driving the piezoelectric scanner with a triangular wave voltage to scan a subject surface and produce data regarding characteristics of a known subject surface containing distance calibration marking;
(b) calculating the data from the scanning process; and,
(c) comparing the data calculated from the triangular wave driven scan to data which would be obtained from a linear scan of the known subjects surface and using the differences between the two to derive the parameters of the general formula which will compensate for the nonlinearity of the piezoelectric scanner and produce a linear scan therefrom.

16. The method of claim 3 wherein said step of calculating the voltage increments to be added at each time interval from the general formula includes the steps of:
(a) driving the piezoelectric scanner with a waveform determined by the general formula to scan a subject surface and produce data regarding characteristics of a known subject surface;
(b) calculating the data from the scanning process; and,
(c) adjusting the parameters of the general formula of the driving voltage until the characteristics from the data match that which would be produced from a linear scan.

17. The method of claim 1, wherein said step of producing a nonlinear driving voltage comprises:
determining constant voltage increments to be applied at changing time intervals.

18. The method of claim 17 wherein said step of determining constant voltage increments to be applied at changing time intervals includes the step of:
calculating each next time interval during scanning at a prior time interval.

19. The method of claim 17 wherein said step of determining constant voltage increments to be applied at changing time intervals includes the steps of:
(a) calculating the series of time intervals to be employed during scanning prior to scanning;
(b) storing the series of time intervals in a computer memory; and,
(c) retrieving each next time interval from the memory during scanning.

20. The method of claim 17 wherein said step of determining constant voltage increments to be applied at changing time intervals includes the steps of:
(a) adjusting parameters of a general formula to make the general formula closely describe the nonlinear nature of the scanner; and,
(b) calculating the time intervals using the adjusted general formula.

21. The method of claim 20 wherein the time intervals each comprise a base time interval with an increasing time increment added thereto and said step of calculating the series of time intervals from the general formula includes the steps of:

a) choosing a general formula for the increasing time increments according to a nonlinear function approximating the nonlinearity of the piezoelectric scanner and containing changeable parameters by means of which the nonlinear function described by the formula and thereby the time increments employed can be changed;
b) using the general formula to drive the piezoelectric scanner to scan a subject surface in forward and backward directions and produce data regarding characteristics of the subject surface;
c) calculating the characteristics from the data for the forward scan direction and from the data for the backward scan direction; and,
d) adjusting the parameters until the differences between the characteristics from the data for the forward scan direction and the characteristics from the data for the backward scan direction are minimized which can only occur when the two scan directions are linear whereby the parameters are established to cause the formula to produce nonlinear time intervals for driving the piezoelectric scanner matching the nonlinearity of the piezoelectric scanner.

22. The method of claim 20, wherein the general formula describes several time increments (N) per scan in which the nth increment Δt(n) during which the voltage is applied to the scanner during one scan line is given by:

$$\Delta t(n) = \frac{A}{\left(1 + \frac{V_{scan}}{V_{cal}} Be^{-Kn/N}\right)}$$

where A, B, and K are pre-established parameters, N is the number of points in one scan line, n is the number of the point on the scan line at which the increment is being made, and where Δt increases with increasing n, to produce a decreasing rate of voltage change.

23. The method of claim 22 and additionally comprising the steps of:
(a) storing pre-determined values of Δt(n) in the computer memory as counts of a clock; and,
(b) during scanning, each time the proper number of counts is reached as compared to the next entry in the memory, incrementing the voltage to the scanner.

24. The method of claim 20 wherein said step of calculating the time intervals at which the voltage increment is to be added includes the steps of:
(a) driving the piezoelectric scanner with a voltage at adjustable time increments determined by the general formula to scan a subject surface and produce data regarding characteristics of a known subject surface;
(b) calculating the data from the scanning process; and,
(c) adjusting the parameters of the general formula for the time increments until the characteristics from the data match that which would be produced from a linear scan.

25. In a method of scanning a nonlinear piezoelectric scanner having an attached end and a free end to produce a cyclic lateral scanning motion of the free end by the application of a changing scan voltage to electrodes carried by the piezoelectric scanner, the method of producing linear data for use in calculations related to a surface scanned by the scanner comprising the steps of:
a) prior to scanning, choosing a general formula describing a predetermined nonlinear function approximating the nonlinearity of the piezoelectric scanner being employed in the device and containing changeable parameters by means of which the nonlinear function described by the formula can be changed, said predetermined function including at least one term which varies as a function of the position of the free end in the line scan;
b) using the piezoelectric scanner to scan a subject surface and produce data regarding characteristics of the subject surface;
c) calculating the characteristics from the data for one scan direction and the characteristics from the data for an opposite scan direction;
d) adjusting the parameters until differences between the characteristics from the data for the two scan directions are minimized, whereby the parameters are established to cause the formula to produce the required nonlinear function specifically describing the nonlinearity of the piezoelectric scanner; and,
e) during scanning, employing the parameters to adjust the indication of the associated positions where the data received regarding the subject surface was taken whereby the data is associated with the actual positions of the subject surface at which it was taken.

26. In a method of producing an image from data obtained from a nonlinear piezoelectric scanner having an attached end and a free end as a result of the application of a changing scan voltage to electrodes carried by the piezoelectric scanner, the improvement by which a cyclic scanning motion of the free end is made virtually linear with time and the speed at which the data is provided for producing the image is increased, comprising the steps of:
a) producing a nonlinear driving voltage which is a predetermined function of the nonlinearity of the piezoelectric scanner, said predetermined function at least including a term which varies as a function of position of the free end within a scan;
b) applying the nonlinear driving voltage to the electrodes of the scanner to scan the free end in a forward scanning motion;
c) obtaining data for use in producing the image during the forward scanning motion;
d) applying the nonlinear driving voltage to the electrodes of the scanner to scan the free end in a backward scanning motion;
e) obtaining data for use in producing the image during the backward scanning motion;
f) moving the scanner in a direction perpendicular to the scanning motion; and
g) repeating steps (c) through (f) until the data needed to create the image has been obtained.

* * * * *